(12) United States Patent
Lu

(10) Patent No.: US 10,886,131 B2
(45) Date of Patent: Jan. 5, 2021

(54) DISPLAY DEVICE MANUFACTURING METHOD AND DISPLAY DEVICE MANUFACTURING APPARATUS

(71) Applicant: Wuhan China Star Optoelectronics Semiconductor Display Technology Co., Ltd., Wuhan (CN)

(72) Inventor: Ming-jen Lu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 102 days.

(21) Appl. No.: 16/095,377

(22) PCT Filed: Aug. 16, 2018

(86) PCT No.: PCT/CN2018/100732
§ 371 (c)(1),
(2) Date: Oct. 22, 2018

(87) PCT Pub. No.: WO2020/000597
PCT Pub. Date: Jan. 2, 2020

(65) Prior Publication Data
US 2020/0058507 A1 Feb. 20, 2020

(30) Foreign Application Priority Data
Jun. 26, 2018 (CN) .......................... 2018 1 0670832

(51) Int. Cl.
*H01L 21/225* (2006.01)
*H01L 21/30* (2006.01)
*H01L 21/67* (2006.01)

(52) U.S. Cl.
CPC ...... *H01L 21/2254* (2013.01); *H01L 21/3003* (2013.01); *H01L 21/67017* (2013.01)

(58) Field of Classification Search
CPC .......... H01L 21/67017; H01L 27/1248; H01L 27/1259; H01L 29/6675; H01L 21/3003; H01L 21/2254
See application file for complete search history.

(56) References Cited

U.S. PATENT DOCUMENTS

2003/0077886 A1 4/2003 Machida et al.
2004/0178429 A1* 9/2004 Tanaka ................ H01L 29/4908
257/288

(Continued)

FOREIGN PATENT DOCUMENTS

CN 1401134 3/2003
CN 1531112 9/2004
(Continued)

*Primary Examiner* — Thanh T Nguyen

(57) ABSTRACT

A display device manufacturing method and a display device manufacturing apparatus are provided. The method includes steps A to D. The step A includes forming a display device. The step B includes disposing the display device in a sealing chamber. The step C includes adding hydrogen gas into the sealing chamber such that hydrogen atoms in the hydrogen gas spread in an insulating layer. The step D includes heating the hydrogen gas and/or the display device in sealing chamber such that the hydrogen atoms in insulating layer spread in the semiconductor member. The present invention can enhance electrical performance of the semiconductor member.

5 Claims, 3 Drawing Sheets

(56) References Cited

U.S. PATENT DOCUMENTS

2009/0209070 A1   8/2009  Tanaka
2018/0033640 A1*  2/2018  Tanimura .............. H01L 21/324

FOREIGN PATENT DOCUMENTS

CN    107658225      2/2018
JP    2001-308284    11/2001

* cited by examiner

DISPLAY DEVICE MANUFACTURING METHOD AND DISPLAY DEVICE MANUFACTURING APPARATUS

RELATED APPLICATIONS

This application is a National Phase of PCT Patent Application No. PCT/CN2018/100732 having International filing date of Aug. 16, 2018, which claims the benefit of priority of Chinese Patent Application No. 201810670832.2 filed on Jun. 26, 2018. The contents of the above applications are all incorporated by reference as if fully set forth herein in their entirety.

FIELD AND BACKGROUND OF THE INVENTION

The present invention relates to fields of display technologies, especially to a display device manufacturing method and a display device manufacturing apparatus.

A conventional display device generally includes a gate electrode, an insulating layer, a semiconductor member, etc. Electrical performance of semiconductor members is an important determinant of display quality of the display device.

There are many factors that affect the electrical performance of semiconductor members, and hydrogen gas is one of those factors. In practice, the inventor found that semiconductor member in the conventional display device has less hydrogen gas content, so the electrical performance of the semiconductor member in the conventional display device is lower.

Therefore, it is necessary to provide a new technical solution to solve the above issue.

SUMMARY OF THE INVENTION

An objective of the present invention is to provide a display device manufacturing method and a display device manufacturing apparatus that can enhance electrical performance of semiconductor members in the display device.

To solve the above issue, technical solutions of the present invention are as follows:

A display device manufacturing method, the method comprises: step A, forming a display device, wherein the display device is disposed with a semiconductor member and an insulating layer, and the insulating layer covers at least a portion of the semiconductor member; step B, disposing the display device in a sealing chamber; step C, adding hydrogen gas into the sealing chamber such that hydrogen atoms in the hydrogen gas spread in the insulating layer; and step D, heating the hydrogen gas and/or the display device in the sealing chamber to a predetermined temperature such that the hydrogen atoms in the insulating layer spread in the semiconductor member; wherein before the step C, the method further comprises: step E, vacuuming the sealing chamber; wherein after the step C, the method further comprises: step F, pressurizing the hydrogen gas in the sealing chamber such that the hydrogen atoms in the insulating layer spreads into the semiconductor member; wherein the step F comprises: in response to volume of an accommodating space in the sealing chamber remaining same, continuously adding the hydrogen gas into the sealing chamber by a hydrogen gas inputter such that a pressure in the sealing chamber increases to facilitate more of the hydrogen atoms spreading from the hydrogen gas into the insulating layer, and to facilitate more of the hydrogen atoms spreading from the insulating layer into the semiconductor member; wherein the predetermined temperature is within a range from 300° C. to 450° C.

In the above display device manufacturing method, the predetermined temperature is within a range from 330° C. to 400° C.

In the above display device manufacturing method, semiconductor material corresponding to the semiconductor member is polycrystalline silicon or amorphous silicon.

A display device manufacturing method, the method comprises: step A, forming a display device, wherein the display device is disposed with a semiconductor member and an insulating layer, and the insulating layer covers at least a portion of the semiconductor member; step B, disposing the display device in a sealing chamber; step C, adding hydrogen gas into the sealing chamber such that hydrogen atoms in the hydrogen gas spread in the insulating layer; and step D, heating the hydrogen gas and/or the display device in the sealing chamber to a predetermined temperature such that the hydrogen atoms in the insulating layer spread in the semiconductor member.

In the above display device manufacturing method, the predetermined temperature is within a range from 300° C. to 450° C.

In the above display device manufacturing method, the predetermined temperature is within a range from 330° C. to 400° C.

In the above display device manufacturing method, before the step C, the method further comprises: step E, vacuuming the sealing chamber.

In the above display device manufacturing method, semiconductor material corresponding to the semiconductor member is polycrystalline silicon or amorphous silicon.

In the above display device manufacturing method, after the step C, the method further comprises: step F, pressurizing the hydrogen gas in the sealing chamber such that the hydrogen atoms in the insulating layer spreads into the semiconductor member.

In the above display device manufacturing method, the step F comprises: in response to volume of an accommodating space in the sealing chamber remaining same, continuously adding hydrogen gas into the sealing chamber by a hydrogen gas inputter such that a pressure in the sealing chamber increases to facilitate more of the hydrogen atoms spreading from the hydrogen gas into the insulating layer, and to facilitate more of the hydrogen atoms spreading from the insulating layer into the semiconductor member.

In the above display device manufacturing method, the step F comprises: compressing the volume of the accommodating space in the sealing chamber such that a pressure of the sealing chamber increases to facilitate more of the hydrogen atoms spreading from the hydrogen gas into the insulating layer, and to facilitate more of the hydrogen atoms spreading from the insulating layer into the semiconductor member.

In the above display device manufacturing method, a piston in the sealing chamber moves along a predetermined direction to compress the accommodating space in the sealing chamber.

A display device manufacturing apparatus, the display device manufacturing apparatus comprises: a sealing chamber, the sealing chamber configured to accommodate a display device; a hydrogen gas inputter, the hydrogen gas inputter configured to input hydrogen gas into the sealing chamber such that hydrogen atoms in the hydrogen gas spread into an insulating layer of the display device; and a heater, the heater disposed in the sealing chamber, the heater configured to heat the hydrogen gas and/or the display device in the sealing chamber to a predetermined temperature such that the hydrogen atoms in the insulating layer spread into a semiconductor member of the display device.

In the above display device manufacturing apparatus, the predetermined temperature is within a range from 300° C. to 450° C.

In the above display device manufacturing apparatus, the predetermined temperature is within a range from 330° C. to 400° C.

In the above display device manufacturing apparatus, the display device manufacturing apparatus further comprises: a vacuuming device, the vacuuming device configured to vacuum the sealing chamber.

In the above display device manufacturing apparatus, semiconductor material corresponding to the semiconductor member is polycrystalline silicon or amorphous silicon.

In the above display device manufacturing apparatus, in response to volume of an accommodating space in the sealing chamber remaining same, the hydrogen gas inputter continuously inputs hydrogen gas into the sealing chamber such that such that a pressure of the sealing chamber increases to facilitate more of the hydrogen atoms spreading from the hydrogen gas into the insulating layer, and to facilitate more of the hydrogen atoms spreading from the insulating layer into the semiconductor member.

In the above display device manufacturing apparatus, the sealing chamber is configured to compress a volume of an accommodating space of the sealing chamber such that a pressure of the sealing chamber increases to facilitate more of the hydrogen atoms spreading from the hydrogen gas into the insulating layer, and to facilitate more of the hydrogen atoms spreading from the insulating layer into the semiconductor member.

In the above display device manufacturing apparatus, a piston is disposed in the sealing chamber, and the piston is configured to move along a predetermined direction to compress the accommodating space of the sealing chamber.

In comparison to the prior art, in the present invention because during the manufacture of the display device of the present invention the semiconductor member is inserted with more hydrogen atoms, content of the hydrogen atoms in the semiconductor member is raised such that electrical performance of the semiconductor member is enhanced to facilitate higher displaying quality of the display device.

To make the above content of the present invention more clear and understandable, preferred embodiments are described in detail below with appended drawings.

DESCRIPTION OF SPECIFIC EMBODIMENTS OF THE INVENTION

The word "embodiment" used in this specification means an instance, a case, or an example. In addition, the articles "a" and "an" used in this specification and the appended claims may be generally construed as "one or more" unless specified otherwise or it is clear to determine the singular form from the context.

A display device 106 of the present invention is adapted for thin film transistor liquid crystal displays (TFT-LCDs), organic light emitting diode (OLED) displays, etc.

Figure 1:
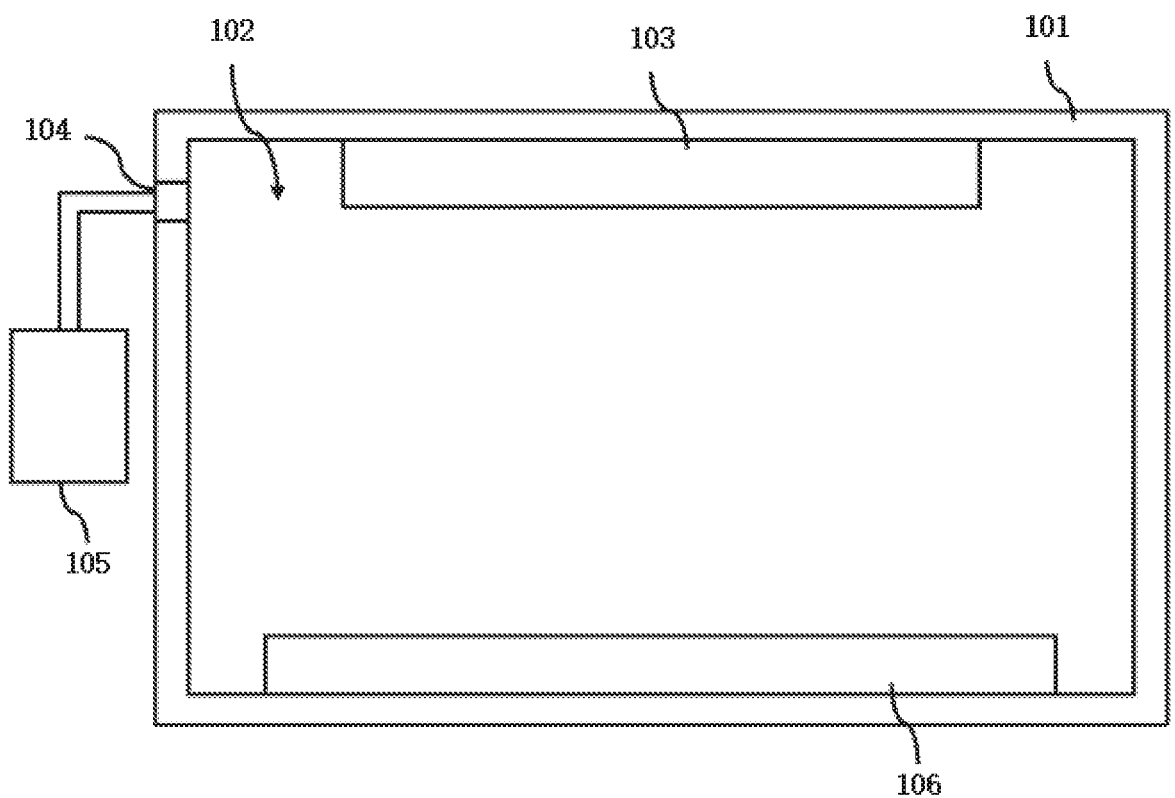
FIG. 1 is a schematic view of a display device manufacturing apparatus of the present invention disposed with a display device.

With reference to FIG. 1, FIG. 1 is a schematic view of a display device manufacturing apparatus of the present invention disposed with a display device 106.

The display device manufacturing apparatus of the present invention comprises a sealing chamber 101, a hydrogen gas inputter 105, and a heater 103.

The sealing chamber 101 is configured to accommodate the display device 106, and the sealing chamber 101 is disposed with a sealing port 104.

The hydrogen gas inputter 105 is configured to input hydrogen gas into the sealing chamber 101 such that hydrogen atoms in the hydrogen gas spread into of an insulating layer of the display device 106. Specifically, the hydrogen gas inputter 105 is configured to input the hydrogen gas through the sealing port 104 into the sealing chamber 101.

The heater 103 is disposed in the sealing chamber 101, and the heater 103 is configured to heat the hydrogen gas and/or the display device 106 in the sealing chamber 101 to a predetermined temperature such that the hydrogen atoms in the insulating layer spread into semiconductor member of the display device 106.

The predetermined temperature is within a range from 300° C. to 450° C. For example, the predetermined temperature is 300° C., 305° C., 310° C., 315° C., 320° C., 325° C., 330° C., 335° C., 340° C., 345° C., 350° C., 355° C., 360° C., 365° C., 370° C., 375° C., 380° C., 385° C., 390° C., 400° C., 405° C., 410° C., 415° C., 420° C., 425° C., 430° C., 435° C., 440° C., 445° C., or 450° C. Preferably, the predetermined temperature is within a range from 330° C. to 400° C.

The display device manufacturing apparatus further comprises a vacuuming device, the vacuuming device is configured to vacuum the sealing chamber 101. Specifically, the vacuuming device is configured to vacuum the sealing chamber 101 before the hydrogen gas inputter 105 inputs the hydrogen gas into the sealing chamber 101.

In response to volume of an accommodating space in the sealing chamber 101 remaining same, the hydrogen gas inputter 105 is configured to continuously input the hydrogen gas into the sealing chamber 101 such that a pressure in the sealing chamber 101 increases to facilitate more of the hydrogen atoms spreading from the hydrogen gas into the insulating layer, and to facilitate more of the hydrogen atoms spreading from the insulating layer into the semiconductor member. Alternatively, the sealing chamber 101 is configured to compress the volume of the accommodating space 102 such that the pressure in the sealing chamber 101 increases to facilitate more of the hydrogen atoms spreading from the hydrogen gas into the insulating layer, and to facilitate more of the hydrogen atoms spreading from the insulating layer into the semiconductor member. Specifically, a piston is disposed in the sealing chamber, and the piston is configured to move along a predetermined direction to compress the accommodating space 102 of the sealing chamber 101.

Semiconductor material corresponding to the semiconductor member is polycrystalline silicon or amorphous silicon.

Figure 2:
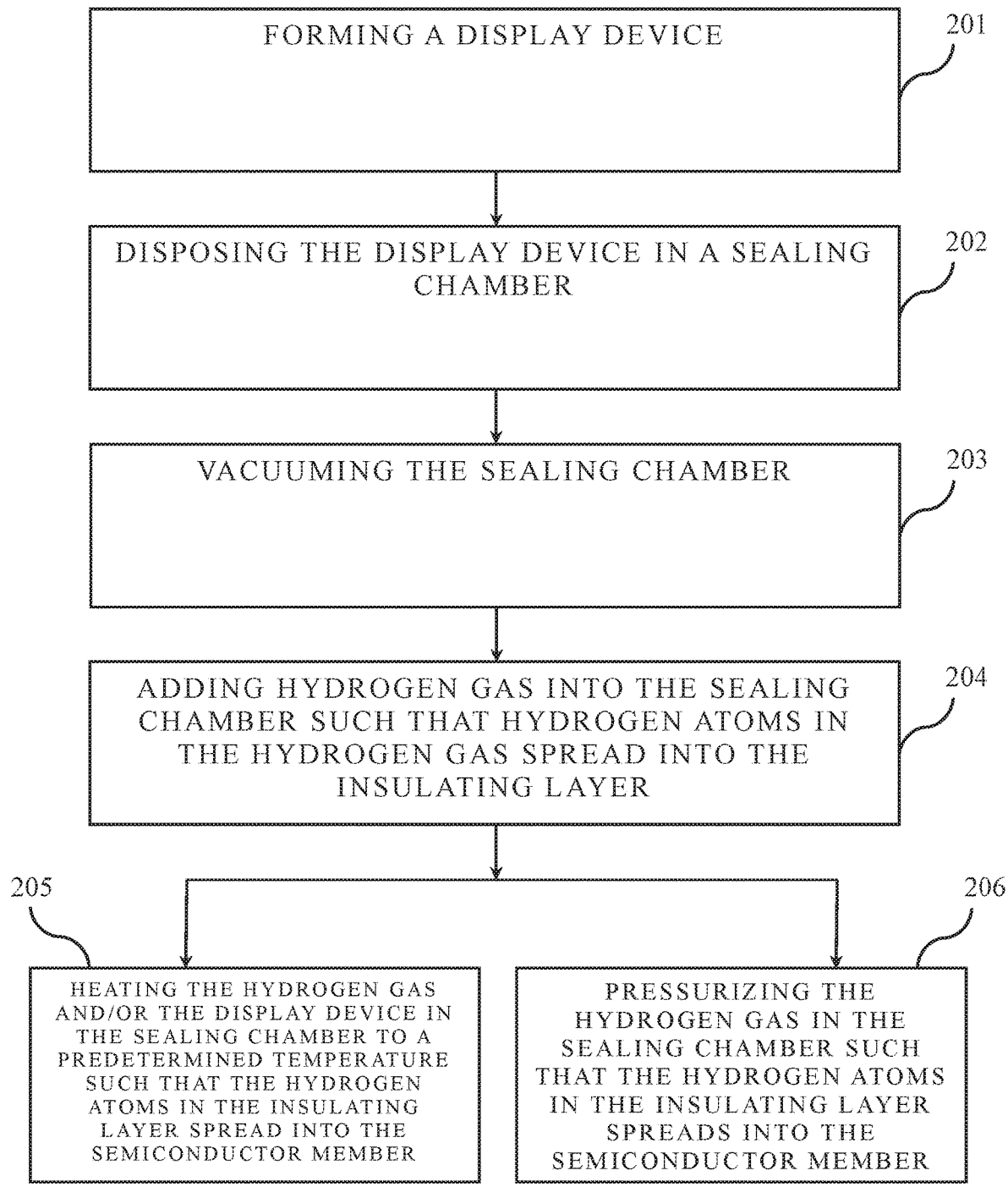
FIG. 2 is a flowchart of a display device manufacturing method of the present invention.
Figure 3:
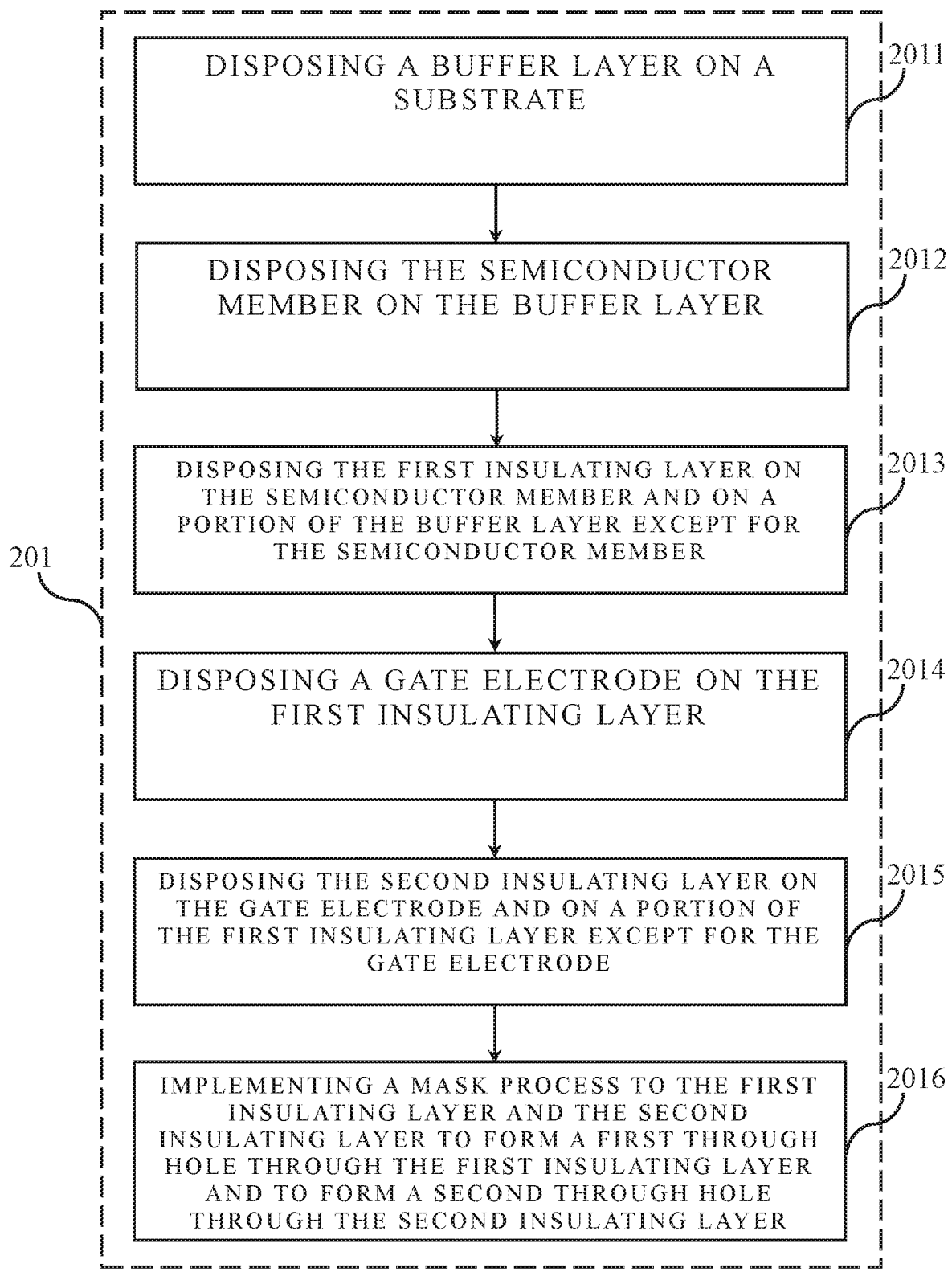
FIG. 3 is a flowchart of a step of forming the display device in FIG. 2.

With reference to FIGS. 2 and 3, FIG. 2 is a flowchart of a display device manufacturing method of the present invention, and FIG. 3 is a flowchart of a step of forming the display device in FIG. 2.

The display device manufacturing method of the present invention comprises:

step A 201, forming a display device 106, wherein the display device 106 is disposed with a semiconductor member and an insulating layer, and the insulating layer covers at least a portion of the semiconductor member;

step B 202, disposing the display device 106 in a sealing chamber 101;

step C 204, adding hydrogen gas into the sealing chamber 101 such that hydrogen atoms in the hydrogen gas spread into the insulating layer; wherein specifically, the hydrogen gas inputter 105 inputs the hydrogen gas into the sealing chamber 101 through a sealing port 104 of the sealing chamber 101;

step D 205, heating the hydrogen gas and/or the display device 106 in the sealing chamber 101 to a predetermined temperature such that the hydrogen atoms in the insulating layer spread into the semiconductor member.

Specifically, a heater 103 is disposed in the sealing chamber 101, and the heater 103 is configured to heat the hydrogen gas and/or the display device 106 such that a temperature of the hydrogen gas and/or the display device 106 reaches the predetermined temperature.

The predetermined temperature is within a range from 300° C. to 450° C. For example, the predetermined temperature is 300° C., 305° C., 310° C., 315° C., 320° C., 325° C., 330° C., 335° C., 340° C., 345° C., 350° C., 355° C., 360° C., 365° C., 370° C., 375° C., 380° C., 385° C., 390° C., 400° C., 405° C., 410° C., 415° C., 420° C., 425° C., 430° C., 435° C., 440° C., 445° C., or 450° C. Preferably, the predetermined temperature is within a range from 330° C. to 400° C.

The insulating layer comprises a first insulating layer and a second insulating layer, the first insulating layer covers at least a portion of the semiconductor member, and at least a portion of the second insulating layer is disposed on the first insulating layer.

The step A 201 comprises:

step a1 2011, disposing a buffer layer on a substrate;

step a2 2012, disposing the semiconductor member on the buffer layer;

step a3 2013, disposing the first insulating layer on the semiconductor member and on a portion of the buffer layer except for the semiconductor member;

step a4 2014, disposing a gate electrode on the first insulating layer;

step a5 2015, disposing the second insulating layer on the gate electrode and on a portion of the first insulating layer except for the gate electrode;

step a6 2016, implementing a mask process to the first insulating layer and the second insulating layer to form a first through hole through the first insulating layer and to form a second through hole through the second insulating layer.

Before the step C 204, the method further comprises:

step E 203, vacuuming the sealing chamber 101. Specifically, a vacuuming device vacuums the sealing chamber 101 through a sealing port 104 of the sealing chamber 101.

After the step C 204, the method further comprises:

step F 206, pressurizing the hydrogen gas in the sealing chamber 101 such that the hydrogen atoms in the insulating layer spreads into the semiconductor member. Specifically, in response to volume of an accommodating space 102 in the sealing chamber 101 remaining same, the hydrogen gas inputter 105 continuously inputs the hydrogen gas into the sealing chamber 101 such that a pressure in the sealing chamber 101 increases to facilitate more of the hydrogen atoms spreading from the hydrogen gas into the insulating layer, and to facilitate more of the hydrogen atoms spreading from the insulating layer into the semiconductor member. Alternatively, compressing the volume of the accommodating space 102 in the sealing chamber 101 such that a pressure of the sealing chamber 101 increases to facilitate more of the hydrogen atoms spreading from the hydrogen gas into the insulating layer, and to facilitate more of the hydrogen atoms spreading from the insulating layer into the semiconductor member. Specifically, a piston in the sealing chamber 101 moves along a predetermined direction to compress the accommodating space 102 of the sealing chamber 101.

The step F 206 and the step D 205 are in no particular order, i.e., after the step C 204, step D 205 can be implemented first and then step F 206 is implemented, or step F 206 is implemented first and then step D 205 is implemented, or step D 205 and step F 206 implemented simultaneously.

Semiconductor material corresponding to the semiconductor member is polycrystalline silicon or amorphous silicon.

In comparison to the prior art, in the present invention because during the manufacture of the display device of the present invention the semiconductor member is inserted with more hydrogen atoms, content of the hydrogen atoms in the semiconductor member is raised such that electrical performance of the semiconductor member is enhanced to facilitate higher displaying quality of the display device.

Although the preferred embodiments of the present invention have been disclosed as above, the aforementioned preferred embodiments are not used to limit the present invention. The person of ordinary skill in the art may make various of changes and modifications without departing from the spirit and scope of the present invention. Therefore, the scope of protection of the present invention is defined by the scope of the claims.

What is claimed is:

1. A display device manufacturing method, wherein the display device manufacturing method comprises:
   step A, forming a display device, wherein the display device is disposed with a semiconductor member and an insulating layer, and the insulating layer covers at least a portion of the semiconductor member;
   step B, disposing the display device in a sealing chamber;
   step C, adding hydrogen gas into the sealing chamber such that hydrogen atoms in the hydrogen gas spread in the insulating layer; and
   step D, heating the hydrogen gas and/or the display device in the sealing chamber to a predetermined temperature such that the hydrogen atoms in the insulating layer spread in the semiconductor member;
   wherein before the step C, the method further comprises:
   step E, vacuuming the sealing chamber;
   wherein after the step C, the method further comprises:
   step F, pressurizing the hydrogen gas in the sealing chamber such that the hydrogen atoms in the insulating layer spreads into the semiconductor member;
   wherein the step F comprises:
   in response to volume of an accommodating space in the sealing chamber remaining same, continuously adding the hydrogen gas into the sealing chamber by a hydrogen gas inputter such that a pressure in the sealing chamber increases to facilitate more of the hydrogen atoms spreading from the hydrogen gas into the insulating layer, and to facilitate more of the hydrogen atoms spreading from the insulating layer into the semiconductor member;

wherein the predetermined temperature is within a range from 300° C. to 450° C.

2. The display device manufacturing method as claimed in claim 1, wherein the predetermined temperature is within a range from 330° C. to 400° C.

3. The display device manufacturing method as claimed in claim 1, wherein semiconductor material corresponding to the semiconductor member is polycrystalline silicon or amorphous silicon.

4. The display device manufacturing method as claimed in claim 1, wherein the step F comprises:

compressing the volume of the accommodating space in the sealing chamber such that a pressure of the sealing chamber increases to facilitate more of the hydrogen atoms spreading from the hydrogen gas into the insulating layer, and to facilitate more of the hydrogen atoms spreading from the insulating layer into the semiconductor member.

5. The display device manufacturing method as claimed in claim 4, wherein a piston in the sealing chamber moves along a predetermined direction to compress the accommodating space in the sealing chamber.

* * * * *